United States Patent [19]
Glover et al.

[11] Patent Number: 5,200,700
[45] Date of Patent: Apr. 6, 1993

[54] REDUCTION OF NMR ARTIFACTS CAUSED BY TIME VARYING LINEAR GEOMETRIC DISTORTION

[75] Inventors: Gary H. Glover, Menlo Park, Calif.; Stephen W. Flax, Wauwatosa, Wis.; Ann Shimakawa, San Francisco, Calif.

[73] Assignee: General Electric, Milwaukee, Wis.

[21] Appl. No.: 620,177

[22] Filed: Nov. 30, 1990

[51] Int. Cl.⁵ .......................................... G01R 33/20
[52] U.S. Cl. .................................... 324/309; 324/307
[58] Field of Search ............... 324/300, 306, 307, 309, 324/313, 314; 128/653 A, 653 AF

[56] References Cited
U.S. PATENT DOCUMENTS

| | | | |
|---|---|---|---|
| 4,727,882 | 3/1988 | Schneider et al. | 324/309 |
| 4,937,526 | 6/1990 | Ehman et al. | 324/309 |
| 4,994,743 | 2/1991 | Glover et al. | 324/309 |
| 5,023,553 | 6/1991 | Sano et al. | 324/309 |
| 5,051,903 | 9/1991 | Pelc et al. | 324/309 |

OTHER PUBLICATIONS

"Reducing Motion Artifacts in Two-Dimensional Fourier Transform Imaging", Haacke et al.; *Magnetic Resonance Imaging*, vol. 4, pp. 359, 1986.

*Primary Examiner*—Louis Arana
*Attorney, Agent, or Firm*—Quarles & Brady

[57] ABSTRACT

NMR image data acquired from a human subject is corrected for view-to-view motion caused by respiration. As each view is acquired the position of the subject is also measured to indicate the distance of the anterior abdominal wall from a reference position. The acquired NMR image data is corrected using the associated measured distances and a simplified model of the motion.

6 Claims, 4 Drawing Sheets

REDUCTION OF NMR ARTIFACTS CAUSED BY TIME VARYING LINEAR GEOMETRIC DISTORTION

BACKGROUND OF THE INVENTION

This invention relates to nuclear magnetic resonance imaging methods. More specifically, this invention relates to a method for controlling image artifacts caused by linear geometric changes in the subject due, for example, to subject respiration in the course of an NMR scan.

NMR has been developed to obtain images of anatomical features of human patients. Such images depict nuclear spin distribution (typically, protons associated with water and tissue), spin-lattice relaxation time $T_1$, and/or spin-spin relaxation time $T_2$ and are of medical diagnostic value. NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well-known, the NMR signal may be a free induction decay (FID) or, preferably, a spin-echo signal.

The preferred embodiments of the invention will be described in detail with reference to a variant of the well-known FT technique, which is frequently referred to as "spin-warp". It will be recognized, however, that the method of the invention is not limited to FT imaging methods, but may be advantageously practiced in conjunction with other techniques, such as multiple angle projection reconstruction disclosed in U.S. Pat. No. 4,471,306, and another variant of the FT technique disclosed in U.S. Pat. No. 4,070,611. The spin-warp technique is discussed in an article entitled "Spin Warp NMR Imaging and Applications to Human Whole Body Imaging" by W. A. Edelstein et al., *Physics in Medicine and Biology*, Vol. 25, pp. 751–756 (1980).

Briefly, the spin-warp technique employs a variable amplitude phase encoding magnetic field gradient pulse prior to the acquisition of NMR spin-echo signals to phase encode spatial information in the direction of this gradient. In a two-dimensional implementation (2 DFT), for example, spatial information is encoded in one direction by applying a phase encoding gradient ($G_y$) along that direction, and then observing a spin-echo signal in the presence of a magnetic field gradient ($G_x$) in a direction orthogonal to the phase-encoding direction. The gradient present during the spin-echo encodes spatial information in the orthogonal direction. In a typical 2 DFT pulse sequence, the magnitude of the phase-encoding gradient pulse $G_y$ is incremented ($\Delta G_y$) monotonically in the sequence of views that are acquired to produce a set of NMR data from which an entire image can be reconstructed.

Object motion during the acquisition of NMR image data produces both blurring and "ghosts" in the phase-encoded direction. Ghosts are particularly apparent when the motion is periodic, or nearly so. For most physiological motion, including cardiac and respiratory motion, each view of the NMR signal is acquired in a period short enough that the object may be considered stationary during the acquisition window. Blurring and ghosts are, therefore, due primarily to the inconsistent appearance of the object from view-to-view, and in particular, due to changes in the amplitude and/or phase of the NMR signal due to the displacement of spins from view-to-view.

Both blurring and ghosts can be reduced if the data acquisition is synchronized with the functional cycle of the object. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition time.

One proposed method for eliminating ghost artifacts is disclosed in U.S. Pat. No. 4,567,893, issued on Feb. 4, 1986, and which is assigned to the same assignee as the present invention. In this prior patent, it is recognized that the distance in the image between the ghosts and the object being imaged is maximized when the NMR pulse sequence repetition time is an odd multiple of one-fourth of the duration of the periodic signal variation (if two phase-alternated RF excitation pulses per view are used, as disclosed and claimed in commonly assigned U.S. Pat. No. 4,443,760, issued Apr. 17, 1984). It is recognized that this ratio can be used to alleviate ghosts due to respiratory motion. While this method, indeed, improves image quality, it does impose a constraint on the NMR pulse sequence repetition time and it often results in a longer total scan time. It also assumes that the motion is periodic. Its effectiveness is diminished when the subject's breathing is irregular because the ghosts are blurred and can overlap the image region of interest.

Another method for reducing the undesirable effects due to periodic signal variations is disclosed in U.S. Pat. No. 4,706,026 issued on Nov. 10, 1987 and entitled "A Method For Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. This involves establishing the order in which either the gradient parameters, i.e. the amplitude of the phase-encoding gradient pulses (in the spin-warp method) or the direction of the readout gradient pulses (in the multiple angle projection reconstruction method) are implemented. For a given signal variation period, a view order is chosen so as to make the NMR signal variation as a function of the phase-encoding amplitude (or gradient direction) be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which issued on May 5, 1987 and is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the patient motion, and particularly, any variations in the periodicity of that motion.

While the above described methods reduce motion artifacts, they do rely on some regularity, or predictability in the cyclic motion which is not always present. For example, irregularities may occur during a breathing cycle which introduce errors into the data acquired for one or more views of the scan. One method for reducing such spurious errors is to perform two scans, or acquire twice the necessary data during a single scan and then average the information acquired for each view to produce an image of increased quality.

SUMMARY OF THE INVENTION

The present invention relates to an improved method and system for retrospectively correcting NMR data acquired during a scan for errors caused by the view-to-view geometric change in the structures being imaged. More particularly, the invention includes means for acquiring a set of NMR image data, acquiring with the set of image data an associated set of motion data that indicates geometric changes that occur from view-to-view during the acquisition of the image data set; means for determining the deviation of the motion data from a reference value; and means for correcting each view of the acquired image data set using the deviation of its associated motion data.

A general object of the invention is to correct acquired NMR image data for movements of the subject which change the geometry from view-to-view. These changes in geometry are monitored as each view of NMR data is acquired during the scan, and the NMR image data is corrected to account for these changes before it is employed to reconstruct an image.

Another object of the invention is to employ an NMR technique for monitoring changes in subject geometry. An NMR pulse sequence is interleaved with the image data acquisition pulse sequence to produce the motion data. No additional apparatus is required to monitor and there is negligible effect on the overall scan time. The NMR motion monitor also measures motion in the exact same slice from which the acquired image data is received, thus providing more accurate geometric information.

Another object of the invention is to provide a motion artifact suppression method which may be used with other such methods. The present invention may be used to correct image data which is acquired in a standard, monotonic view order, or image data which is acquired in a non-monotonic view order as described in the above-cited U.S. Patents. When used with the latter artifact suppression techniques the corrections are made according to the present invention, but they are much smaller in magnitude.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
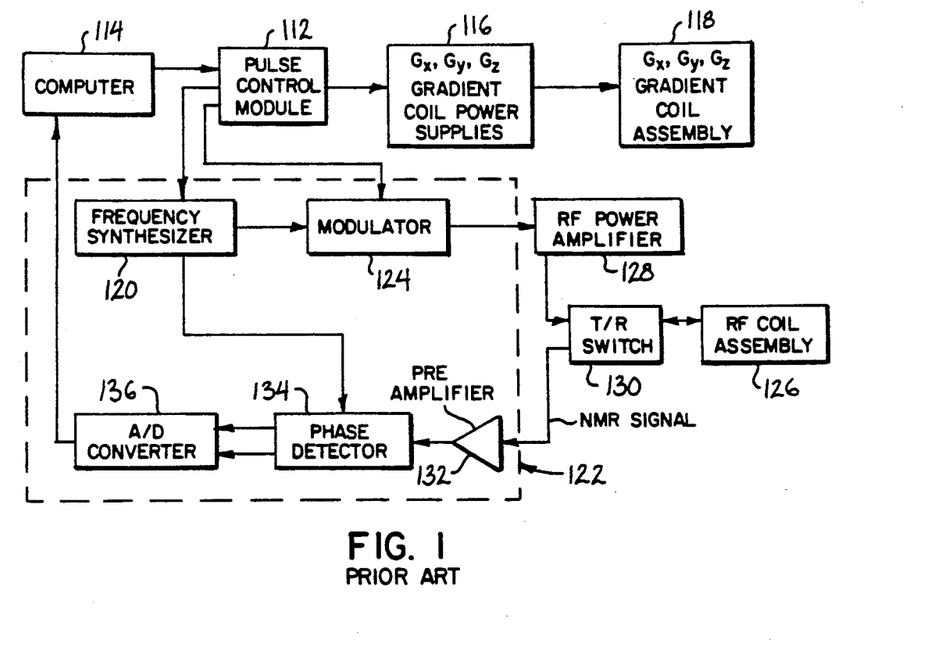
FIG. 1 is an electrical block diagram of an NMR system which employs the present invention.

FIG. 1 is a simplified block diagram of an NMR imaging system which employs the preferred embodiment of the invention. The system includes a pulse control module 112 which provides properly timed pulse waveform signals, under the control of a host computer 114, to magnetic field gradient power supplies collectively designated at 116. These power supplies 116 energize gradient coils which form part of a gradient coil assembly generally indicated by block 118. The assembly contains coils which produce the $G_x$, $G_y$ and $G_z$ magnetic field gradients directed in the x, y, and z directions, respectively, of the Cartesian coordinate system. Continuing with reference to FIG. 1, the pulse control module 112 provides activating pulses to an RF synthesizer 120 which is part of an RF transceiver, portions of which are enclosed by dash-line block 122. The pulse control module 112 also supplies signals to a modulator 124 which modulates the output of the RF frequency synthesizer 120. The modulated RF signals are applied to an RF coil assembly 126 through an RF power amplifier 128 and a transmit/receive switch 130. The RF signals are used to excite nuclear spins in a sample object (not shown) which is to be imaged.

The NMR signals from the excited nuclear spins are sensed by the RF coil assembly 126 and applied through the transmit/receive switch 130 to an RF preamplifier 132. The amplified NMR signals are applied to a quadrature phase detector 134, and the detected signals are digitized by A/D converter 136 and applied to computer 114 for storage and processing in a well-known manner.

Figure 2:
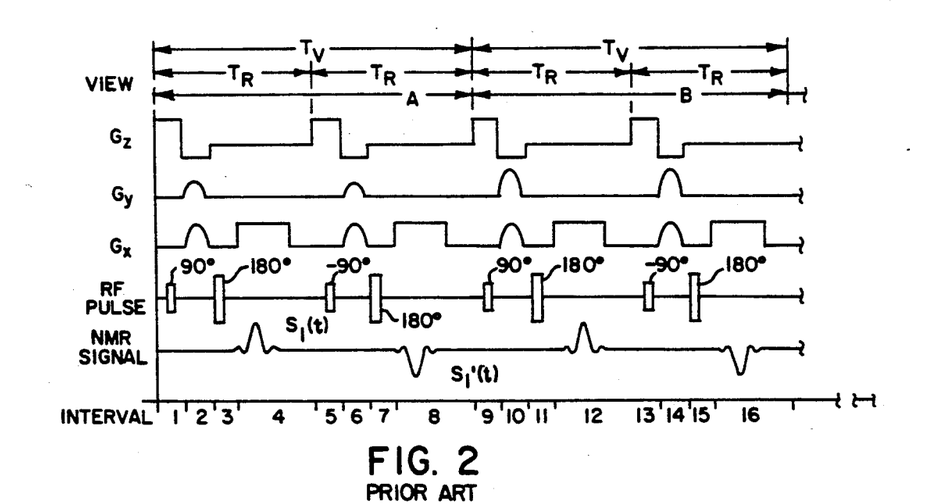
FIG. 2 is an exemplary imaging pulse sequence which is executed by the system of FIG. 1.

Reference is made to FIG. 2 which depicts two views of a conventional imaging pulse sequence of the type known as two-dimensional Fourier transforms (2 DFT), and which is also referred to as two-dimensional "spin-warp". This pulse sequence is useful in obtaining, in a well-known manner, imaging NMR data to reconstruct images of an object being investigated. The two views are indicated at "A" and "B" and they are identical with the exception of the phase-encoding gradient field $G_y$. Each view is a pulse sequence which utilizes phase-alternated RF excitation pulses which, as disclosed and claimed in the U.S. Pat. No. 4,443,760, produce phase-alternated NMR signals $S_1(t)$ and $S_1'(t)$ to cancel certain baseline errors in the NMR system.

Referring now to View A in FIG. 2, there is shown in interval 1 (indicated along the horizontal axis) a selective 90° RF excitation pulse applied in the presence of a positive $G_z$ magnetic field gradient pulse. Pulse control module 112 (FIG. 1) provides the needed control signals to the frequency synthesizer 120 and modulator 124 so that the resulting excitation pulse is of the correct phase and frequency to excite nuclear spins only in a predetermined region of the object being imaged. Typically, the excitation pulse can be amplitude modulated by a (sin x)/x function. The frequency of the synthesizer 120 is dependent on the strength of the applied polarizing magnetic field and the particular NMR species being imaged in accordance with the well-known Larmor equation. The pulse control module 112 also applies activating signals to the gradient power supplies 116 to generate, in this case, the $G_z$ gradient pulse.

Continuing with reference to FIG. 2, $G_x$, $G_y$ and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the $G_z$ gradient waveform over interval 1. The function of the negative $G_z$ pulse is to rephase the nuclear spins excited in interval 1. The $G_y$ gradient pulse is a phase-encoding pulse selected to have a different amplitude in each of Views A, B, ..., etc., to encode spatial information in the direction of the gradient. The number of different $G_y$ gradient amplitudes is typically selected to equal at least the number of pixel resolution elements the reconstructed image will have in the phase-encoding (Y) direction. Typically, 128, 256, or 512 different gradient amplitudes $G_y$ are selected and in the typical NMR system, the $G_y$ values are incremented a fixed amount from one view to the next until the NMR scan is complete.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin-echo signal is produced typically by the application of a 180° RF pulse in interval 3. As is known, the 180° RF pulse is a pulse which reverses the direction of spin dephasing so as to produce the spin-echo signal. The spin-echo signal is sampled in interval 4 in the presence of a gradient pulse $G_x$ to encode spatial information in the direction (X) of this gradient.

As indicated above, baseline error components are eliminated by using an additional NMR measurement in each view. This second measurement is substantially identical to the first with the exception that the RF excitation pulse in interval 5 of View A is selected to be 180° out of phase (as suggested by the minus sign) relative to the excitation pulse in interval 1 of View A. As a result, the spin-echo signal $S_1'(t)$ in interval 8 is 180° out of phase with the spin-echo signal $S_1(t)$ in interval 4.

If the signal $S_1'(t)$ is subtracted from $S_1(t)$, only those components of the signals with reversed sign in the signal $S_1'(t)$ are retained. The baseline error components thus cancel.

The process described above with reference to View A is repeated for View B and so on for all amplitudes of the phase-encoding $G_y$ gradient. The NMR image data which is collected during this scan is stored in the host computer 114 where it is processed to produce image data suitable for controlling a CRT display.

As the above described conventional NMR scan is performed, NMR data is acquired from all physical locations within the plane, or slice, of the object being imaged. If an accurate image is to be reconstructed, then both the object and the measurement conditions must be stable, or fixed, during the time needed to complete the entire NMR scan. The present invention deals with the very practical situations in which this is not the case, but instead, the measurement conditions change and the geometry of the subject is different from view-to-view during the scan.

One such situation occurs when an image is to be produced through the abdomen of a human subject. In this case, much of the material being imaged is in motion due to the subject's breathing, and the time needed to acquire the NMR data for an entire image will often transcend many respiration cycles. If NMR data is acquired continuously throughout the respiration cycles, the subject will be disposed differently from view-to-view and the reconstructed image will contain many artifacts which reflect this geometric change in the subject.

Figure 4:
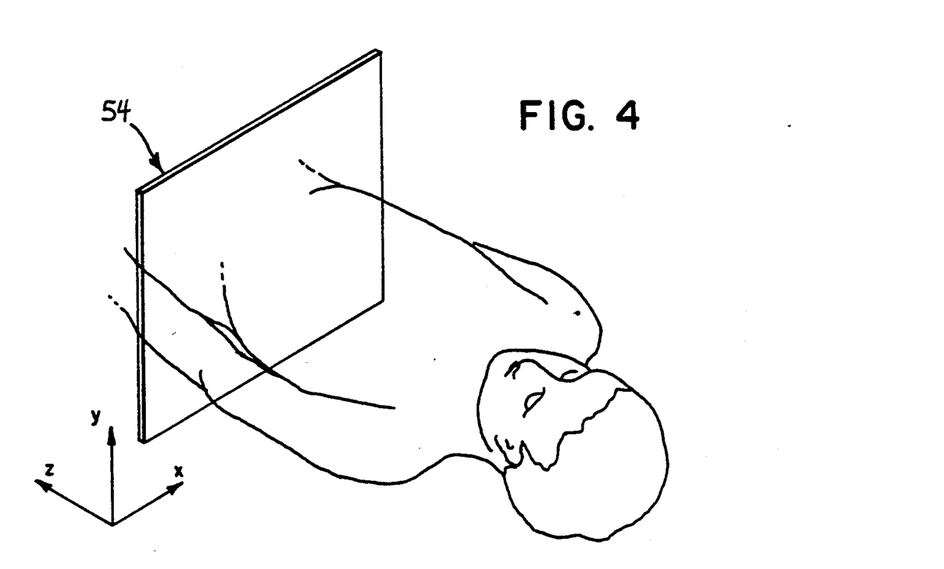
FIG. 4 is a pictorial representation of a slice taken through a patient's abdominal cavity.
Figure 5:
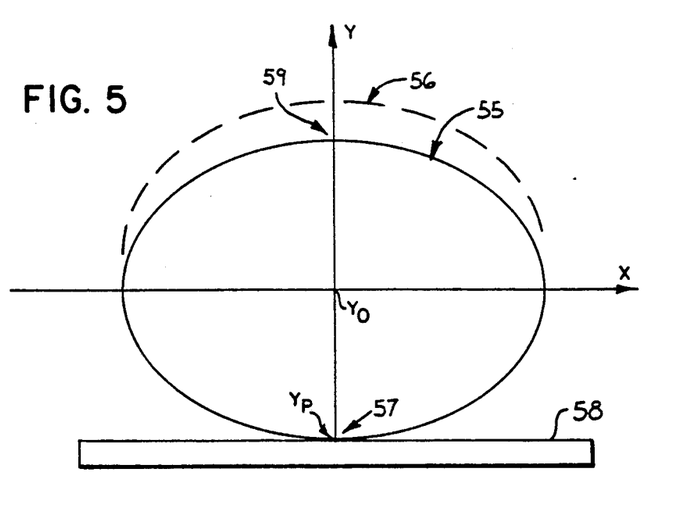
FIG. 5 is a schematic representation of a model of patient motion caused by respiration.

Referring particularly to FIGS. 4 and 5, a slice 54 through the chest, or abdomen of a human subject is often imaged for diagnostic purposes. A slice select gradient $G_z$ is employed in the NMR pulse sequence to locate the slice 54 along the Z axis, a readout gradient $G_x$ is applied during each pulse sequence to determine the field of view and resolution along the lateral, x axis, and a series of phase encoding gradients $G_y$ are applied during successive views of the scan to acquire data from the full vertical, or y axis extent of the slice 54. The complete scan requires minutes of time during which the human subject is breathing. Accordingly, as each view is acquired the geometry of the patient changes due to respiration.

This change in geometry during the respiratory cycle is illustrated schematically in FIG. 5, where the solid outline 55 represents the shape of the abdominal walls during one phase of the respiration and the dashed outline 56 represents the shape during another phase of the respiration cycle. The motion which occurs in the vertical direction ranges from a minimum at the posterior abdominal wall 57 which rests on a supporting table 58, to a maximum at the anterior abdominal wall 59. At least through the center of the abdominal cavity where the organs of major interest reside, the amount of vertical motion during respiration is between the minimum and maximum and is approximately linearly related to the vertical distance from the posterior wall 57.

In order to practice the present invention it is necessary to measure the vertical position of the anterior abdominal wall 59 as the NMR data is acquired for each view of the scan. While this could be done using conventional respiration monitor devices, in the preferred embodiment of the invention this motion, or position information is acquired using the NMR method described in co-pending U.S. patent application Ser. No.

427,401 titled "A Method For Monitoring Respiration with Acquired NMR Data" which was filed on Oct. 10, 1989 and is now U.S. Pat. No. 4,994,743.

Figure 3:
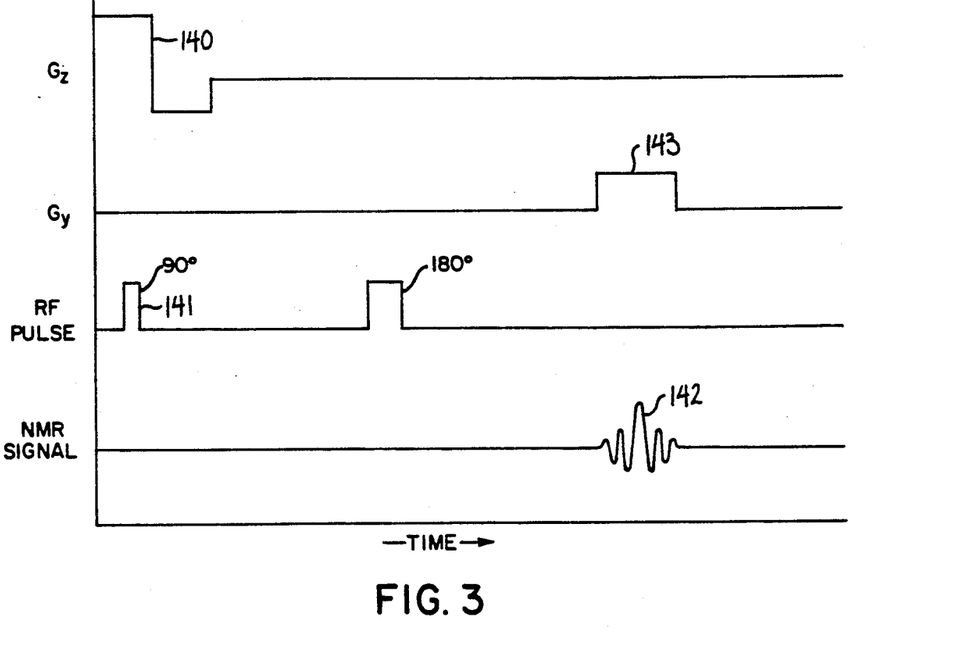
FIG. 3 is a preferred embodiment of a motion pulse sequence which is interleaved with the imaging pulse sequence of FIG. 2.

To acquire NMR motion information during the scan a separate pulse sequence is interleaved between each view of FIG. 2. This motion NMR pulse sequence is illustrated in FIG. 3 and is executed just prior to each view of the image data scan. This motion NMR pulse sequence differs in a number of ways from the image pulse sequence. A slice select gradient pulse 140 is employed during the application of a 90° RF excitation pulse 141 to excite spins in the same slice 54 as the image data being acquired, however, no phase encoding gradient pulse is applied. Instead, the NMR echo signal 142 is acquired during a readout gradient pulse 143, which in the preferred embodiment is produced along the vertical, y axis by the gradient field $G_y$. In the preferred embodiment an echo time (TE) of 4.5 msec is employed to place water and fat signals in phase, and only the central 2 msec of the NMR echo signal 142 is collected. This pulse sequence is repeated and an NMR signal is acquired for each view of acquired image data. The resulting motion NMR data set is stored in the computer 114 for use as will be described below.

In the alternative, the motion NMR data may be acquired in the same pulse sequence with the image NMR data. For example, after the 90° excitation pulse in the first interval in the sequence of FIG. 2 and before the application of the gradient pulses in the second interval, projection NMR data may be acquired in the presence of a $G_y$ readout gradient pulse. This $G_y$ readout gradient is comprised of a leading negative lobe, a central positive lobe applied during data acquisition and a trailing negative lobe which rephases the spins. The pulse sequence then continues as shown in FIG. 2 to apply the $G_y$ phase encoding pulse, the 180° excitation pulse and the $G_x$ readout gradient pulse during the acquisition of the image NMR data.

Figure 6:
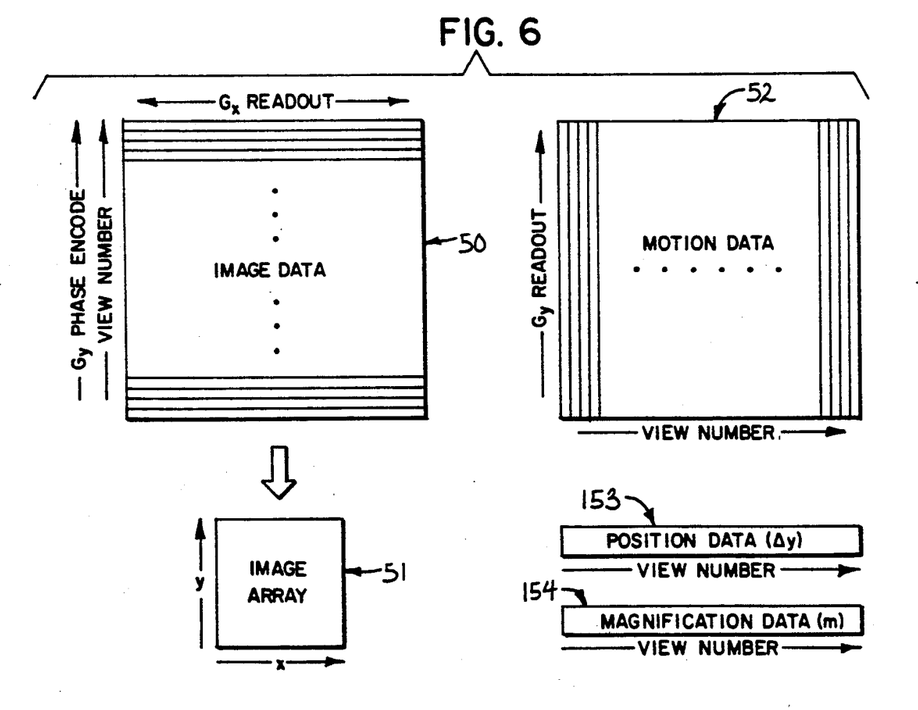
FIG. 6 is a schematic representation of data structures which are produced when practicing the present invention.

The NMR image data set which is acquired during a scan is illustrated in FIG. 6. The image data which is acquired is stored in a two-dimensional array 50 that has a size which is determined by the chosen image resolution (i.e. 128 by 128; 256 by 256, or 512 by 512 pixels). Each row of data in the array 50 represents the digitized data acquired during one view, and each row is acquired with a different value of phase encoding magnetic field gradient $G_y$. When data has been acquired for each value of phase encoding gradient $G_y$, the scan is complete and the array 50 may be processed to produce an image array 51 which indicates the brightness of each pixel on the display. This processing in the normal, uncorrected case includes performing a first Fourier transformation of the image data in array 50 along the readout dimension, and then performing a second Fourier transformation on the resulting data array along the phase encoding dimension. The values of each element in the resulting data array indicates the brightness of their corresponding pixels in the image array 51.

As the image data set in array 50 is acquired, a corresponding set of NMR motion data is acquired as described above and is stored in a two-dimensional array 52. Just prior to the acquisition of each row of image data for the array 50, a corresponding column of motion data is acquired for the array 52 using the pulse sequence of FIG. 3. Referring again to FIGS. 4 and 5, this motion data is acquired from a projection of the subject in the slice 54 being imaged. This projection is the intensity of all the NMR signals from the subject in the slice 54, integrated along the x direction, and if the patient is centered on the table 58, it extends through the center of the abdominal cavity. The $G_y$ gradient field is applied during the readout of the motion NMR signal and enough samples are acquired to provide the desired position measurement resolution. At the completion of the scan, the motion data set includes one column of motion data in the array 52 for each row, or view, of NMR image data in the array 50. The order in which the views are acquired may either be monotonic, or it may be an artifact suppressing non-monotonic order. Regardless of the view order used, for each view of NMR image data there is a corresponding column of motion data.

The present invention is implemented by a program executed by computer 114 after the scan is completed and before the image is reconstructed from the image data array 50 as described above. More specifically, each row or view of NMR data in the array 50 is corrected by using information in its corresponding column of motion data in the array 52. After each row of image data has been corrected, the corrected image data set is then employed in the usual manner described above to reconstruct the displayable image.

To correct the NMR image data the motion data is first processed in the manner described in the above cited co-pending U.S. patent application to produce a set of values $\Delta Y$ which indicate the change in vertical position of the anterior abdominal wall 59 for each view of the acquired NMR image data.

Each value $\Delta Y$ is a distance of the anterior abdominal wall from a reference position, and each value is associated with one view of acquired NMR image data in the array 50. This set of position data $\Delta Y$ is stored in a one-dimensional array 153 as shown in FIG. 6.

Referring particularly to FIG. 5, a simplified model of respiratory motion is considered in which the subject's abdominal wall expands and contracts in only the Y direction and the contents of the abdominal cavity expand and contract in a linear manner about a stationary pivot point $Y_p$. The pivot point $Y_p$ is chosen as the posterior abdominal wall 57, since it remains quite stationary during normal respiration. In other words, this simplified model presumes that when the anterior abdominal wall moves a distance $\Delta Y$, that the contents of the abdominal cavity move a distance (d) which is a linear function of its position (y) relative to the pivot point ($Y_p$) and the anterior abdominal wall ($Y_r$).

$$d = \Delta Y(Y - Y_p)/(Y_r - Y_p) \tag{1}$$

The present invention corrects the collected image data in array 50 so that the effects of such motion are substantially eliminated. In other words, the signals produced by the moving spins are corrected for each view such that it appears as though the spins remain stationary from view-to-view. The manner in which these corrections are made is determined by the direction of the measured motion (y axis in the preferred embodiment) relative to the readout gradient direction (x axis in the preferred embodiment).

The first step in the correction process is to calculate an array of magnification values (m) from the position data ($\Delta Y$). As shown in FIG. 6, for each view number a magnification value (m) is calculated from the position data ($\Delta Y$) in the array 153 and stored in an array 154.

$$m = \Delta Y/(Y_r - Y_p) + 1 \tag{2}$$

where:

$Y_r$ is a reference position of the anterior abdominal wall and $Y_p$ is the position of the posterior abdominal wall.

This magnification number is the amount by which the image must be magnified along the y axis to keep its size constant. Let $f(X,Y,V)$ represent the image as measured during a view (V) and $f_o(X,Y,o)$ represent that image as measured during a reference view. Then, during any other view (V) the object can be represented as:

$$f(X,Y,V)=f_o(X,(Y-Y_p)/m(V)+Y_p) \quad (3)$$

If $F_o(k_x,k_y)$ is the Fourier transformation of the image as acquired during the reference view, then the measured values in the image data array 50 ($Fm(k_x,k_y,V)$) are related to this reference image by the magnification data (m(V)) as follows:

$$F_m(k_x,k_y,V)=m(V)F_o(k_x,k_y m(V))e^{-ik_y Y_p[m(v)-1]} \quad (4)$$

Thus, the data in the image array 50 ($F_m(k_x,k_y,V)$) can be modified to produce an array of image data $F_o(k_x,k_y)$ which represents the data as if no motion had occurred This modification is performed by performing a magnification in $k_y$ space and applying a phase shift to the measured data as follows:

$$F_o(k_x,k_y)=F_m(k_x,k_y/m(V),V)/m(V)e^{ik_y Y_p(m(V)-1)/m(V)} \quad (5)$$

The modified image data $F_o(k_x,k_y)$ is then employed in the conventional manner to reconstruct an image.

The modification of the image data according to equation (5) can be carried out in a number of ways by a program which is executed by the computer 114 (FIG. 1). One such program is illustrated in FIG. 7 and is employed in the preferred embodiment of the invention where the motion is sensed along the y axis and the NMR data is readout in the presence of a gradient along the x axis.

Figure 7:
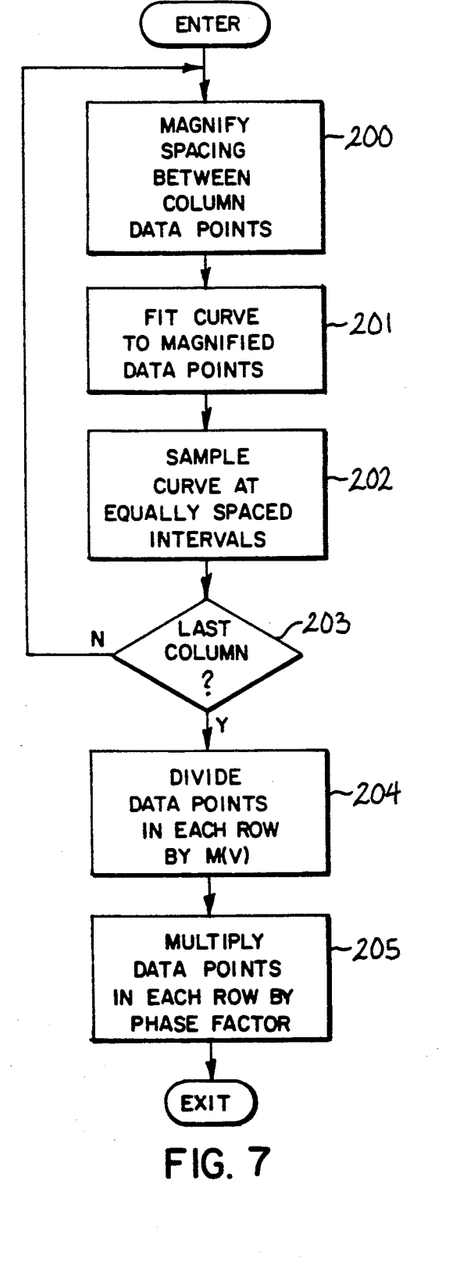
FIG. 7 is a flow chart of a program employed to correct image data acquired under one set of conditions.

Referring particularly to FIG. 7, a loop is entered in which the data in each column of the image data array 50 is magnified. As indicated at process block 200, the first step is to plot the data points in the column. Rather than spacing the data points equally, however, the spacing between each point is changed by an amount determined by the magnification factor m(V) for that view. For example, if the ideal spacing between data points is selected as "1", then the actual spacing between the data point in view (V) and its predecessor view (V−1) is calculated as follows:

$$spacing = m(V) \quad (6)$$

Once the data points have been plotted, a curve is fit to them as indicated by process block 201. Numerous curve fitting methods may be employed and are known to those skilled in the art, but in the preferred embodiment a cubic spline was fit to the data points. Next, as indicated by process block 202, the cubic spline curve is sampled, or digitized, at equally spaced intervals and the results stored back in the same column of the array 50. This process of magnification is repeated for each column of the array 50 until the loop is exited at decision block 203.

In accordance with equation (5) above, the next step is to divide each magnified data point by its magnification factor m(V) and to shift its phase. As indicated by process block 204, the division is performed on each row (V) of magnified data points in the array 50 by dividing each data point by the value m(V). Each complex data point in the array 50 is then phase shifted as indicated at process block 204 by multiplying each by the following factor:

$$\exp(ik_y Y_p(m(V)-1)). \quad (7)$$

The data points in the image data array 50 are now fully corrected for motion along the y axis caused by respiration and an image array 51 can now be produced as described above by performing a two-dimensional Fourier transformation.

Figure 8:
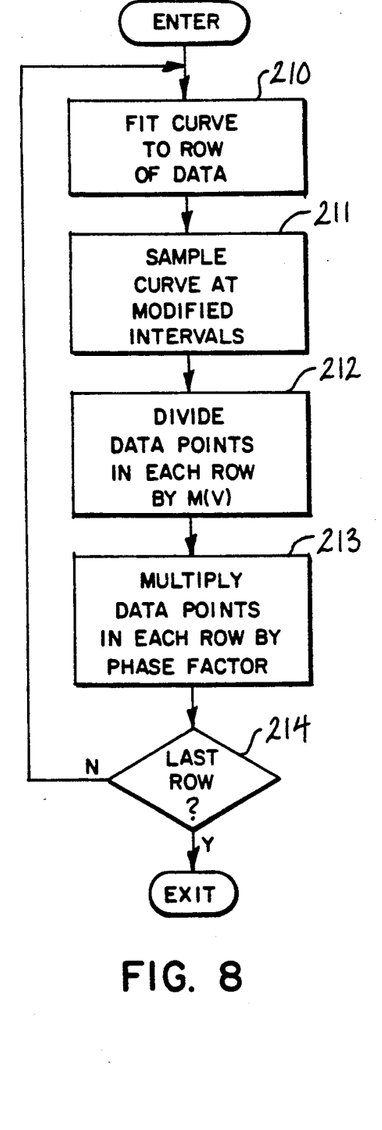
FIG. 8 is a flow chart of a program used to correct image data acquired under a second set of conditions.

An alternative correction program is illustrated in FIG. 8 for use with pulse sequences in which the readout direction of the acquired image data is the same as the motion to be corrected. In such case, a loop is entered at process block 210 in which each row of data in the image array is corrected. Each row of data is a digitized representation of the NMR echo signal and the first step is to fit a curve to this digitized data. As indicated above, a cubic spline curve is employed although many other methods are known and can be used satisfactorily. This curve is then sampled at process block 211 at intervals determined by the magnification factor m(V) which corresponds to this row, or view, of data. If the raw data points are spaced at an interval "1", then the curve is sampled at intervals:

$$sampling\ interval = m(V) \quad (8)$$

These digitized samples are restored in the image data array and then each is divided by the magnification factor m(V) at process block 212 and phase shifted at process block 213 as described above with respect to FIG. 7. When the last row is corrected, as indicated at decision block 214, the image data is fully corrected and an image can be reconstructed as described above.

It will be apparent to those skilled in the art that many techniques may be employed to correct the acquired image data in accordance with the teachings of the present invention, and that the two techniques described in the preferred embodiments are only a sample of the manner in which the corrections indicated by equation (5) can be made.

We claim:

1. A method for correcting a set of NMR image data comprised of a plurality of digitized NMR signals that are acquired over a period of time during which the subject moves due to respiration, the steps comprising:

(a) measuring the position of the subject as each digitized NMR signal is acquired;

(b) calculating a motion value ($\Delta Y$) for each digitized NMR signal which indicates the position of the subject with respect to a reference position;

(c) calculating a magnification factor m(V) for each motion value ($\Delta Y$) which is proportional to the motion value ($\Delta Y$) and a distance from a stationary point in the subject;

(d) correcting each digitized NMR signal in the NMR image data set using an associated magnification factor m(V); and, (e) reconstructing an image using the corrected NMR image data set.

2. The method as recited in claim 1 in which the correction of each digitized NMR signal using the associated magnification factor m(V) includes:
(a) fitting a curve to the digitized NMR signal;
(b) sampling the curve at intervals determined by the magnification factor m(V) to produce a corrected digitized NMR signal; and,
(c) dividing each corrected digitized NMR signal by its associated magnification factor m(V).

3. The method as recited in claim 2 in which each corrected digitized NMR signal is multiplied by a phase factor which is determined by the value of its associated magnification factor m(V).

4. The method as recited in claim 1 in which the NMR image data set is stored as an array in which each digitized NMR signal is a row of elements and the correction of each digitized NMR signal using the associated magnification factor m(V) includes:
(di) fitting a curve to the digitized NMR signal values in a column of the array;
(dii) sampling the curve at intervals determined by the magnification factors m(V) associated with the respective elements in the column to produce a column of corrected digitized NMR signal values;
(diii) dividing each corrected digitized NMR signal value by its associated magnification factor m(V); and,
(div) repeating steps (di) through (diii) for each column in the array.

5. The method as recited in claim 4 in which each corrected digitized NMR signal value in the array is multiplied by a phase factor which is determined by the value of its associated magnification factor m(V).

6. The method as recited in claim 1 in which the position of the subject is measured as each digitized NMR signal is acquired by:
(ai) performing a motion pulse sequence along with each image data pulse sequence to acquire a position NMR signal;
(aii) performing a Fourier transformation on the acquired position NMR signal; and
(aiii) detecting the position of a characteristic feature in the transformed position NMR signal.

* * * * *